United States Patent
Alhorr et al.

(10) Patent No.: US 9,482,708 B2
(45) Date of Patent: Nov. 1, 2016

(54) ENHANCED REVERBERATION CHAMBER

(71) Applicant: ETS-Lindgren Inc., Cedar Park, TX (US)

(72) Inventors: Faris Alhorr, Austin, TX (US); Garth D'Abreu, Austin, TX (US)

(73) Assignee: ETS-Lindgren Inc., Cedar Park, TX (US)

( * ) Notice: Subject to any disclaimer, the term of this patent is extended or adjusted under 35 U.S.C. 154(b) by 30 days.

(21) Appl. No.: 14/166,156

(22) Filed: Jan. 28, 2014

(65) Prior Publication Data

US 2014/0210502 A1 Jul. 31, 2014

Related U.S. Application Data

(60) Provisional application No. 61/758,006, filed on Jan. 29, 2013.

(51) Int. Cl.
*G01R 27/28* (2006.01)
*G01R 29/08* (2006.01)
*G01R 27/32* (2006.01)

(52) U.S. Cl.
CPC .......... *G01R 27/32* (2013.01); *G01R 29/0821* (2013.01)

(58) Field of Classification Search
CPC .......... G01R 31/2808; G01R 31/2887; G01R 31/2893; G01R 31/289; G01R 29/105
USPC .............. 324/627, 703, 750.25, 401, 705.12, 324/144; 343/703; 333/231–232; 455/67.11–67.12; 73/865.6
IPC ...................... G01R 31/2808, 31/2887, 31/2893
See application file for complete search history.

(56) References Cited

U.S. PATENT DOCUMENTS

| | | | |
|---|---|---|---|
| 2,364,371 A | 12/1944 | Katzin | |
| 2,431,962 A | 12/1947 | Rettinger | |
| 2,520,602 A | 8/1950 | Linder | |
| 2,720,629 A | 10/1955 | Edson et al. | |
| 3,281,728 A | 10/1966 | Dome | |
| 3,745,226 A | 7/1973 | Nichols et al. | |
| 3,806,943 A | 4/1974 | Holloway | |
| 4,013,861 A | 3/1977 | Westfall | |
| 4,463,324 A | 7/1984 | Rolfs | |
| 4,494,117 A | 1/1985 | Coleman | |
| 4,513,290 A | 4/1985 | Lefevre et al. | |
| 4,733,165 A | 3/1988 | Richardson et al. | |

(Continued)

FOREIGN PATENT DOCUMENTS

WO 2012171562 A1 12/2012

OTHER PUBLICATIONS

Jesch, "Measurement of Shielding Effectiveness of Cable and Shielding Configurations by Mode-Stirred Techniques", IEEE Transactions on Electromagnetic Compatibility, vol. 30, No. 3, pp. 222-228, Aug. 1988.

(Continued)

*Primary Examiner* — Patrick Assouad
*Assistant Examiner* — Taqi Nasir
(74) *Attorney, Agent, or Firm* — Christopher & Weisberg, P.A.

(57) ABSTRACT

A method and apparatus for an enhanced reverberation chamber are disclosed. In one embodiment, one or more positioners are coupled to a tuner, such that when the tuner moves, the positioner moves. A device involved with a test may be mounted to the positioner so that when the positioner moves, the device moves.

17 Claims, 2 Drawing Sheets

(56) References Cited

U.S. PATENT DOCUMENTS

| | | | |
|---|---|---|---|
| 4,794,218 | A | 12/1988 | Nakano et al. |
| 4,906,998 | A | 3/1990 | Shibuya |
| 4,912,741 | A | 3/1990 | Tanaka et al. |
| 4,968,983 | A | 11/1990 | Maeda |
| 4,972,191 | A | 11/1990 | Ishino et al. |
| 5,001,494 | A | 3/1991 | Dorman et al. |
| 5,012,041 | A | 4/1991 | Sims et al. |
| 5,023,594 | A | 6/1991 | Wallace |
| 5,110,216 | A | 5/1992 | Wickersheim et al. |
| 5,134,405 | A | 7/1992 | Ishihara et al. |
| 5,215,959 | A | 6/1993 | Van Duzer |
| 5,300,939 | A * | 4/1994 | Maeda .................. H01Q 1/125 343/703 |
| 5,327,091 | A | 7/1994 | Loughry |
| 5,530,412 | A | 6/1996 | Goldblum |
| 5,805,667 | A | 9/1998 | Alvarez et al. |
| 5,874,715 | A | 2/1999 | Choi |
| 5,877,479 | A | 3/1999 | Yu |
| 6,070,662 | A | 6/2000 | Ciglenec et al. |
| 6,172,650 | B1 | 1/2001 | Ogawa et al. |
| 6,181,136 | B1 | 1/2001 | Choi et al. |
| 6,201,955 | B1 | 3/2001 | Jasper et al. |
| 6,597,723 | B1 | 7/2003 | Zeira et al. |
| 6,686,818 | B1 | 2/2004 | Weibler et al. |
| 6,850,851 | B1 | 2/2005 | Fourestie et al. |
| 7,228,105 | B2 | 6/2007 | Rowell et al. |
| 7,286,961 | B2 | 10/2007 | Kildal |
| 7,444,264 | B2 | 10/2008 | Kildal |
| 2004/0183547 | A1* | 9/2004 | Kildal .................. G01R 29/105 324/627 |
| 2006/0055592 | A1 | 3/2006 | Leather et al. |
| 2011/0043222 | A1* | 2/2011 | Leferink ............ G01R 29/0821 324/627 |
| 2011/0084887 | A1* | 4/2011 | Mow ...................... G01R 29/10 343/703 |

OTHER PUBLICATIONS

Hatfield, "Shielding Effectiveness Measurements Using Mode-Stirred Chambers: A Comparison of Two Approaches", IEEE Transactions on Electromagnetic Compatibility, vol. 30, No. 3, pp. 229-238, Aug. 1988.

Hill, "Electronic Mode Stirring for Reverberation Chambers", IEEE Transactions on Electromagnetic Compatibility, vol. 36, No. 4, pp. 294-299, Nov. 1994.

Hill, "Spatial Correlation Function for Fields in a Reverberation Chamber", IEEE Transactions on Electromagnetic Compatibility, vol. 37, No. 1, p. 138, Feb. 1995.

Harms et al., "Simulating Measurements for a Cable Radiation Study", IEEE Transactions on Electromagnetic Compatibility, vol. 38, No. 1, pp. 25-30, Feb. 1996.

Mitra et al., "Power Transfer Characteristics of a Microwave Reverberation Chamber", IEEE Transactions on Electromagnetic Compatibility, vol. 38, No. 2, pp. 197-200, May 1996.

Herke et al., "The Use of Mode Stirred Chambers in EM Evaluation Testing", 10th International Conference on Electromagnetic Compatibility, pp. 193-198, Sep. 1997.

Kwon et al., "Ray Analysis of Electromagnetic Field Build-Up and Quality Factor of Electrically Large Shielded Enclosures", IEEE Transactions on Electromagnetic Compatibility, vol. 40, No. 1, pp. 19-26, Feb. 1998.

Hatfield et al., "Investigations to Extend the Lower Frequency Limit of Reverberation Chambers", pp. 20-23, 1998.

Freyer et al., "Verification of Fields Applied to an EUT in a Reverberation Chamber Using Statistical Theory", pp. 34-38, 1998.

Goldsmith et al., "Design, Construction, Computational EM Modelling, and Characterisation of an Aircraft Sized Reverberation Chamber and Stirrer", pp. D55-1-D55-8, 1998.

Leferink, "High Field Strength in a Large Volume: The Intrinsic Reverberation Chamber", Hollandse Signaalapparaten B.V. Environmental Test Laboratory, pp. 24-27, 1998.

Slattery et al., "Characterization of a Reverberation Chamber for Automotive Susceptibility", pp. 265-269, 1998.

Lehman et al., "Verification of Fields Applied to an EUT in a Reverberation Chamber Using Numerical Modeling", pp. 28-33, 1998.

Hill, "Electromagnetic Theory of Reverberation Chambers", United States Department of Commerce, Technology Administration, National Institute of Standards and Technology, NIST Technical Note 1506, pp. 1-55, Dec. 1998.

Bunting et al., "A Two-Dimensional Finite-Element Analysis of Reverberation Chambers", IEEE Transactions on Electromagnetic Compatibility vol. 41, No. 4, pp. 280-289, Nov. 1999.

Petirsch et al., "Investigation of the Field Uniformity of a Mode-Stirred Chamber Using Diffusors Based on Acoustic Theory", IEEE Transactions on Electromagnetic Compatibility, vol. 41, No. 4, pp. 446-451, Nov. 1999.

Svetanoff et al., "Development of High Performance Tuners for Mode-Stirring and Mode-Tuning Applications", pp. 29-34, 1999.

Hatfield et al., "Frequency Characterization of Reverberation Chambers", pp. 190-193.

Mitra et al., "Statistical Simulations and Measurements Inside a Microwave Reverberation Chamber", pp. 48-53.

Harima et al., "FDTD Analysis on the Effect of Stirrers in a Reverberation Chamber", Yokosuka Radio Communications Research Center, Communications Research Laboratory, M.P.T., pp. 260-263.

Hatfield et al., "Reverberation Characteristics of a Large Welded Steel Shielded Enclosure", pp. 38-43.

Lehman et al., "Characterization of the Maximum Test Level in a Reverberation Chamber", Science & Engineering Associates, Inc., Albuquerque, NM 87110, USA, pp. 44-47.

* cited by examiner

ENHANCED REVERBERATION CHAMBER

CROSS-REFERENCE TO RELATED APPLICATION

This application is related to and claims priority to U.S. Provisional Patent Application Ser. No. 61/758,006, filed Jan. 29, 2013, entitled ENHANCED REVERBERATION CHAMBER, the entirety of which is incorporated herein by reference.

FIELD

The written description relates to a method and system for enhanced mode stirring in a reverberation chamber.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
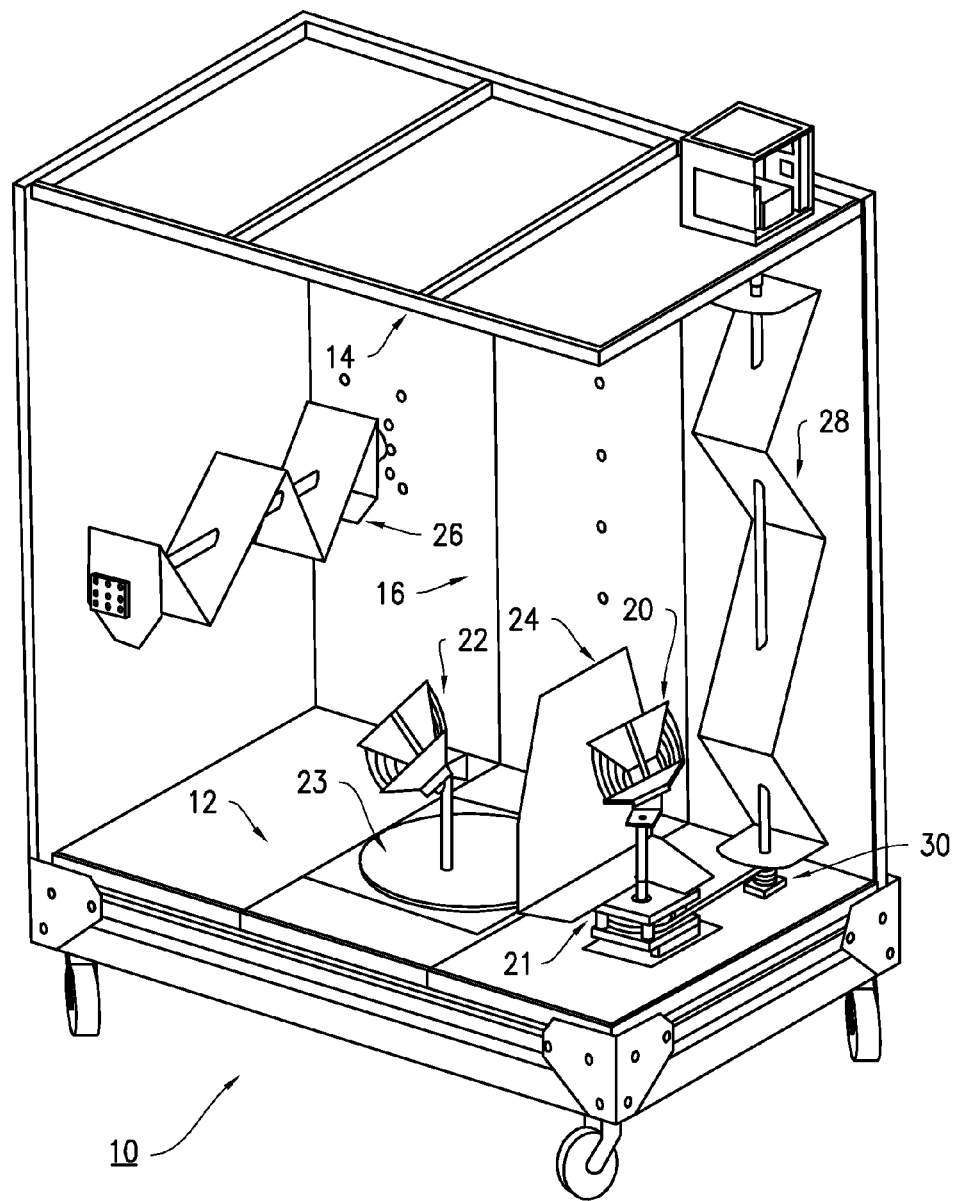
FIG. 1 is a diagram of an enhanced reverberation chamber with a positioner mechanically coupled to a movable tuner.

Before describing in detail exemplary embodiments that are in accordance with the present invention, it is noted that the embodiments reside primarily in combinations of apparatus components and processing steps related to mode stirring in a reverberation chamber. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Reverberation chambers as described herein may be used to conduct electromagnetic compatibility measurements and other over the air, OTA, performance tests of passive and active wireless devices. Compared with other test methods, reverberation chambers offer advantages of lower cost, higher field-to-input power ratios, and the ability to accept large test systems. Reverberation chambers operate by using their interior surfaces to reflect internally radiated RF fields. One or more rotating paddles, or tuners, also called mode stirrers, may be used to change the cavity boundary conditions. This creates fields having statistical isotropy and field homogeneity over a large working volume.

FIG. 1 is a diagram of an enhanced reverberation chamber 10 having a floor 12, ceiling 14, and four sides 16 (only two sides shown) to enclose a device under test, DUT. In FIG. 1, a measurement antenna 20 is mounted on a first positioner 21, and a calibration antenna 22 is mounted on a second positioner 23. The antennas may be omni-directional or highly directional. In the alternative to a calibration antenna 22, a device to be tested may be mounted on the second positioner 23. The second positioner 23 may be fixed or moveable. In another alternative embodiment, a measurement antenna may be mounted on the second positioner 23 and a device to be tested may be mounted on the first positioner. Thus, the first positioner 21 carries a first device involved in a test, and the second positioner 23 carries a second device involved in the test. The positions and motion of the positioners may be controlled by software and/or a user.

A line of sight, LOS, shield 24 may be mounted between the measurement antenna 20 and the calibration antenna 22. The LOS shield 24 may be metallic and used to block line of sight electric field components between the devices mounted on the two positioners 21 and 23. In some embodiments, the LOS shield 24 is at least a half wavelength away from any radiating device in the reverberation chamber 10, including antennas 20 and 22.

Note that although not shown in FIG. 1, in some embodiments, the first positioner 21 may be mechanically coupled to the second positioner 23 so that the second positioner 23 moves when the first positioner 21 moves.

The reverberation chamber 10 may also include a tuner or mode stirrer such as a horizontal z-fold tuner 26 and/or a vertical z-fold tuner 28. The z-fold tuners 26 and 28 may be made of large aluminum reflecting sheets supported on either a rigid box frame or a single spine and designed to provide efficient reflecting surfaces desirable for use in the reverberation chamber 10. In particular, at one end of the vertical z-fold tuner 28 is a pulley wheel 30 which rotates with the vertical z-fold tuner 28. Mounted to the pulley 30 by a belt is the first positioner 21.

Figure 2:
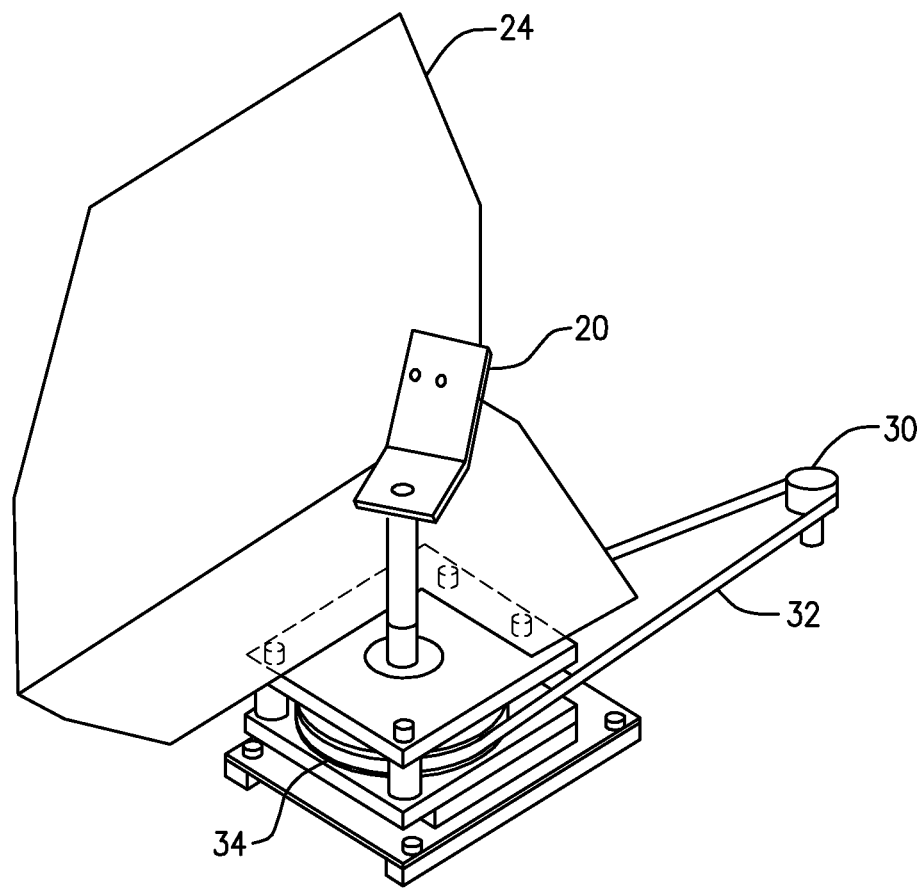
FIG. 2 is a diagram of a mechanical assembly for coupling a positioner to a rotating shaft that couples to a tuner.

FIG. 2 shows the positioning device 21 in more detail. The pulley wheel 30 carries a belt 32 that is also carried by a second pulley wheel 34 of the positioning device 21. A tuner is mounted to the pulley wheel 30. A motor (not shown) may be coupled to the first pulley wheel 30 or the second pulley wheel 34. Thus, when the tuner rotates, a device such as a device involved in the test, such as an antenna or wireless device, rotates as well. Note that the device involved in the test may be mounted so that it is offset from an axis of rotation of the positioning device 21. Similarly, a device involved in the test mounted to the second positioner 23 may be mounted so that it is offset from an axis of rotation of the second positioner 23. When a device involved in the test is mounted so that it is offset from an axis of rotation of its positioner 21 or 23, it traverses a path that encompasses an axis of rotation of the positioner.

Thus, either positioner or both positioners may be mechanically coupled to a tuner so that when the tuner moves, the one or both of the positioners move. Referring again to FIG. 1, the calibration antenna 22 or device under test, DUT, or measurement antenna 20 may be mounted on the second positioner 23 and may optionally be offset from the axis of rotation. In this alternative embodiment, the tuner is mechanically coupled to a pulley wheel by a belt so that when the tuner rotates, the positioner 23 also rotates. In an alternative embodiment, both the first and second positioners 21 and 23 may be coupled to rotate with the rotation of a tuner coupled to the first and second positioners. In yet an alternative embodiment, a shaft upon which the tuner is mounted is coupled to a shaft upon which the positioner 21 and/or 23 is mounted by meshed gears, enabling the rotational speed of the tuner to vary from the rotational speed of the positioner 21 and/or 23.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A reverberation chamber, comprising:
   a first positioner configured to mount one of a first device to be tested and an antenna so that one of the first device to be tested and the antenna moves when the first positioner moves; and
   a tuner mechanically coupled to the first positioner so that movement of the tuner is mechanically coupled to movement of the one of the first device to be tested and the antenna.

2. The reverberation chamber of claim 1, wherein the tuner is mechanically coupled to the movement of the one of the first device to be tested and the antenna via a belt and pulley system.

3. The reverberation chamber of claim 1, wherein the tuner is mechanically coupled to the movement of the one of the first device to be tested and the antenna via gears.

4. The reverberation chamber of claim 1, wherein the first positioner is configured to mount the one of the first device to be tested in a location that is offset from an axis of rotation of the first positioner.

5. The reverberation chamber of claim 1, further comprising a second positioner configured to mount the other of the first device to be tested and the antenna so that the other of the first device to be tested and the antenna moves when the second positioner moves.

6. The reverberation chamber of claim 5, wherein the second positioner is mechanically coupled to at least one of the first positioner and the tuner.

7. The reverberation chamber of claim 5, wherein the first device to be tested is one of an antenna and a wireless device.

8. A method of mode stirring in a reverberation chamber, the method comprising:
   mechanically coupling movement of a tuner to movement of a first positioner so that when the tuner moves, the first positioner moves; and
   mounting a first device to be a tested onto the first positioner so that when the first positioner moves, the first device to be tested moves.

9. The method of claim 8, wherein the movement of the first tuner is rotation about an axis of the tuner.

10. The method of claim 9, wherein the movement of the first device to be tested is circular about an axis of rotation of the first positioner.

11. The method of claim 8, wherein the movement of the first device to be tested is circular about an axis of rotation of the first positioner.

12. The method of claim 8, further comprising mounting an antenna onto a second positioner, movement of the second positioner coupled to movement of the first positioner.

13. The method of claim 12, wherein the second device is an antenna and the first device is an antenna.

14. A test configuration in a reverberation chamber, the test configuration comprising:
   a first positioner;
   a tuner; and
   a first device to be tested, the first device to be tested mounted to the first positioner, the first positioner coupled mechanically to the tuner so that when the tuner moves, the first positioner moves and the first device to be tested moves.

15. The test configuration of claim 14, wherein the first device to be tested is mounted such that the first device to be tested traverses a path that encompasses an axis of rotation of the first positioner.

16. The test configuration of claim 14, wherein the mechanical coupling is such that a speed of rotation of the tuner is proportional to a speed of rotation of the first positioner.

17. The test configuration of claim 14, further comprising a second device to be tested is mounted to a second positioner.

* * * * *